United States Patent [19]
Heilbronner

[11] Patent Number: 5,438,479
[45] Date of Patent: Aug. 1, 1995

[54] HIGH DENSITY, HEAT-DISSIPATING CIRCUIT ASSEMBLY WITH ACCESSIBLE COMPONENTS

[75] Inventor: Heinrich Heilbronner, Stein, Germany

[73] Assignee: Export-Contor Aussenhandelsgesellschaft mbH, Nuremberg, Germany

[21] Appl. No.: 148,972

[22] Filed: Nov. 8, 1993

[30] Foreign Application Priority Data

Nov. 7, 1992 [DE] Germany .......... 42 37 632.7

[51] Int. Cl.⁶ .......................................... H05K 7/20
[52] U.S. Cl. ................... 361/707; 257/724; 361/719; 439/74
[58] Field of Search ............... 361/704, 707, 709, 784, 361/785, 790, 717–719; 174/16.3, 252; 165/80.3, 185; 257/707, 713, 723, 724, 727; 439/66–69, 74, 77, 485

[56] References Cited

U.S. PATENT DOCUMENTS

| | | | |
|---|---|---|---|
| 4,739,448 | 4/1988 | Rowe | 361/719 |
| 4,771,365 | 9/1988 | Cichocki | 361/784 |
| 4,812,949 | 3/1989 | Fontan et al. | |
| 4,868,349 | 9/1989 | Chia | 174/52.4 |
| 5,155,661 | 10/1992 | Nagesh | |
| 5,157,588 | 10/1992 | Kim | 361/784 |
| 5,343,359 | 8/1994 | Morton | 361/707 |

FOREIGN PATENT DOCUMENTS

| | | |
|---|---|---|
| 0450157 | 11/1990 | European Pat. Off. . |
| 0449640 | 3/1991 | European Pat. Off. . |
| 262317 | 7/1987 | German Dem. Rep. . |
| 3521572 | 6/1985 | Germany . |
| 3628556 | 8/1986 | Germany . |
| 3630830 | 9/1986 | Germany . |
| 3643288 | 12/1986 | Germany . |
| 4007566 | 3/1990 | Germany . |
| 4111247 | 4/1991 | Germany . |

*Primary Examiner*—Gerald P. Tolin
*Attorney, Agent, or Firm*—Mark Catan; Thomas R. Morrison

[57] ABSTRACT

A circuit assembly includes a platen for pressing carrier plates, bearing heat-dissipating components, against a heat sink. Circuits on one carrier plate are electrically connected with circuits on the other carrier plate by corresponding contacts on each carrier plate which the platen presses into mutual contact as it presses the carrier plates against the heat sink. The surfaces to which the carrier plates are pressed is stepped, which serves to align the carrier plates with respect to each other. One or more substrates, bearing other circuit elements, are attached to the platen and electrically connected to circuits on the carrier plate by resilient contact elements attached to the platen. The resilient contact elements press against contact surfaces of the carrier plates and substrates to make connections. Recesses in the platen also facilitate alignment of the carrier plates and components thereon. The interconnection of components by the resilient contact elements, and the locating effect of recesses in the heat sink and platen makes it possible to assemble and disassemble the circuit assembly rapidly and conveniently.

20 Claims, 3 Drawing Sheets

HIGH DENSITY, HEAT-DISSIPATING CIRCUIT ASSEMBLY WITH ACCESSIBLE COMPONENTS

BACKGROUND OF THE INVENTION

This invention relates to high-density circuit assemblies that use heat sinks to facilitate component cooling and specifically to such circuit assemblies where component-bearing carrier plates are pressed against heat sinks by platens.

A known assembly, from the present applicant's Offenlegungsschrift (German laid open application) DE-A 4 111 247, includes a circuit assembly incorporating a heat sink. A carrier plate has components to be cooled by heat transfer to the heat sink. The carrier plate is pressed against the heat sink by a platen. The platen has a resilient cushion element which faces, and is pressed against, the carrier plate to insure good thermal contact between the carrier plate and the heat sink.

In the applicant's supplementary patent application P 41 22 428, another known circuit assembly includes a platen with a rigid mounting element and a rigid bridge element, with an resilient cushion element between them.

In both, of the above-mentioned prior art assemblies (DE-A 4 111 247 and P 41 22 428), and other circuit assemblies shown in Offenlegungsschrift DE-A 35 09 456 and DE-A 35 21 572, the carrier plates and their components are virtually inaccessible. A first side of the carrier plate is adjacent to the heat sink. Because it is desirable to maintain good thermal contact between components on the carrier plate and heat sink, the heat sink must essentially cover a first side of the carrier plate and any heat dissipating components on that side. The carrier plate is pressed from the second side of the carrier plate to the heat sink to insure good thermal contact between tile carrier plate and the heat sink. The device used to press the carrier plate generally covers the second side. Thus, both sides of the portion of the carrier plate containing the power-dissipating components are essentially covered leaving the components thereon virtually inaccessible. Therefore, modification of the overall circuit assembly can be very difficult. The same problem exists with, for example, the circuit arrangement known from Offenlegungsschrift DE-A 35 09 456 or DE-A 35 21 572.

Still another known circuit assembly from Patentschrift (German Patent) DE-C 36 28 556, includes at least one semiconductor wafer with semiconductor circuit elements on it. The semiconductor wafer rests on a base plate. Conductor elements around the periphery of the wafer are wired to the semiconductor circuit elements. The semiconductor circuit elements are fully encapsulated in insulation material, and the conductor elements, partly so. Contacts of time conductor elements protrude through the insulation material on a side facing away from the base plate. Surfaces of the protruding contacts lie in a single plane. The protruding contacts are thereby available to make electrical contact by pressing against a contact plate on another part such as a circuit board. Because the circuit elements are encapsulated in the insulation material, they are not susceptible to modification. Therefore, this semiconductor assembly permits no convenient modification of semiconductor components.

A semiconductor assembly of hybrid structure is described in Offenlegungsschrift DE-A 3 643 288. This semiconductor component assembly permits a high degree of integration. The structure also permits electrical pretesting of all components prior to final assembly. Additionally, the structure permits the simple fastening of components to the carrier plate and electrically coupling the components to external circuits.

OBJECTS AND SUMMARY OF THE INVENTION

It is an object of the present invention to provide a circuit assembly that permits a high degree of integration.

It is another object of the present invention to provide a circuit assembly that allows components to be easily and quickly assembled.

It is still another object of tile present invention to provide a circuit assembly that permits heat-dissipating components to be densely packaged.

It is still another object of the present invention to provide a circuit assembly that permits at least some circuit components to be modified and/or tested after the circuit has been finally assembled without disassembling tile entire circuit assembly.

It is still another object of the present invention to provide a circuit which allows all components to be pretested prior to final assembly.

It is still another object of the present invention to provide a circuit assembly that permits convenient access to high heat-dissipating components by means of simple partial disassembly.

It is still another object of the present invention to provide a circuit assembly which achieves a high degree of integration.

Briefly stated, there is disclosed, a circuit assembly including a platen for pressing carrier plates bearing heat-dissipating components, against a heat sink. Circuits on one carrier plate are electrically connected with circuits on the other carrier plate by corresponding contacts on each carrier plate which the platen presses into mutual contact as it presses the carrier plates against the heat sink. The surfaces to which tile carrier plates are pressed is stepped, which serves to align the carrier plates with respect to each other. One or more substrates, bearing other circuit elements, are attached to the platen and electrically connected to circuits on the carrier plate by resilient contact elements attached to the platen. The resilient contact elements press against contact surfaces of the carrier plates and substrates to make connections. Recesses in tile platen also facilitate alignment of the carrier plates and components thereon. The interconnection of components by tile resilient contact elements, and tile locating effect of recesses in the heat sink and platen makes it possible to assemble and disassemble tile circuit assembly rapidly and conveniently.

According to an embodiment of the present invention, there is disclosed, a high density circuit assembly, comprising: a heat sink, a carrier plate having at least one component to be cooled, a platen having a substrate attached thereto, means for pressing the carrier plate against the heat sink, whereby tile carrier plate and tile at least one are cooled, tile substrate being substantially electrically insulating, the substrate having a first circuit, tile substrate being substantially parallel to the carrier plate and the platen having means for electrically compacting tile first circuit to the second circuit.

According to another embodiment of the present invention, there is disclosed, a high density circuit assembly, comprising: a heat sink, carrier plates, at least one of the carrier plates having at least one component to be cooled, each carrier plate having a circuit, two of the carrier plates being substantially parallel and lying in different planes, a platen for pressing the carrier plates against the heat sink, a substrate on the platen, the substrate being substantially electrically insulating, the substrate having a circuit, the substrate being substantially parallel to the carrier plates and the platen having means for electrically connecting at least one of the conductors to at least one of the carrier plates.

According to still another embodiment of the present invention, there is disclosed, A high density circuit assembly, comprising: a heat sink, two carrier plates, a first of the two having a first circuit, a second of the two having a second circuit, at least one of the two having at least one component to be cooled, a platen for pressing the carrier plates against the heat sink, the platen having a rigid bridge element with a pressing surface for pressing against at least one of the two, the platen having a rigid mounting element, a resilient cushion element between the rigid mounting element and the rigid bridge element, at least one substrate between at least one of tile resilient cushion element and the rigid bridge element and the resilient cushion element and the rigid mounting element, tile at least one substrate being substantially parallel to the carrier plates, the at least one substrate having a third circuit and the platen having means for electrically connecting the third circuit to at least one of tile first circuit and tile second circuit.

According to still another embodiment of the present invention, there is disclosed, a high density circuit assembly, comprising: a heat sink, carrier plates, the heat sink having at least one recess for receiving at least one of the carrier plates, each carrier plate having a circuit, a platen for pressing the carrier plates, the at least one of the carrier plates being positioned in a plane different from at least another of the carrier plates, the position being such that a first portion of the at least one of the carrier plates overlaps a second portion of the at least another of tile carrier plates, first contacts on tile first portion, second contacts on the second portion, the first contacts being positioned to make electrical contact with the second contacts when the platen is pressed against the carrier plates. The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
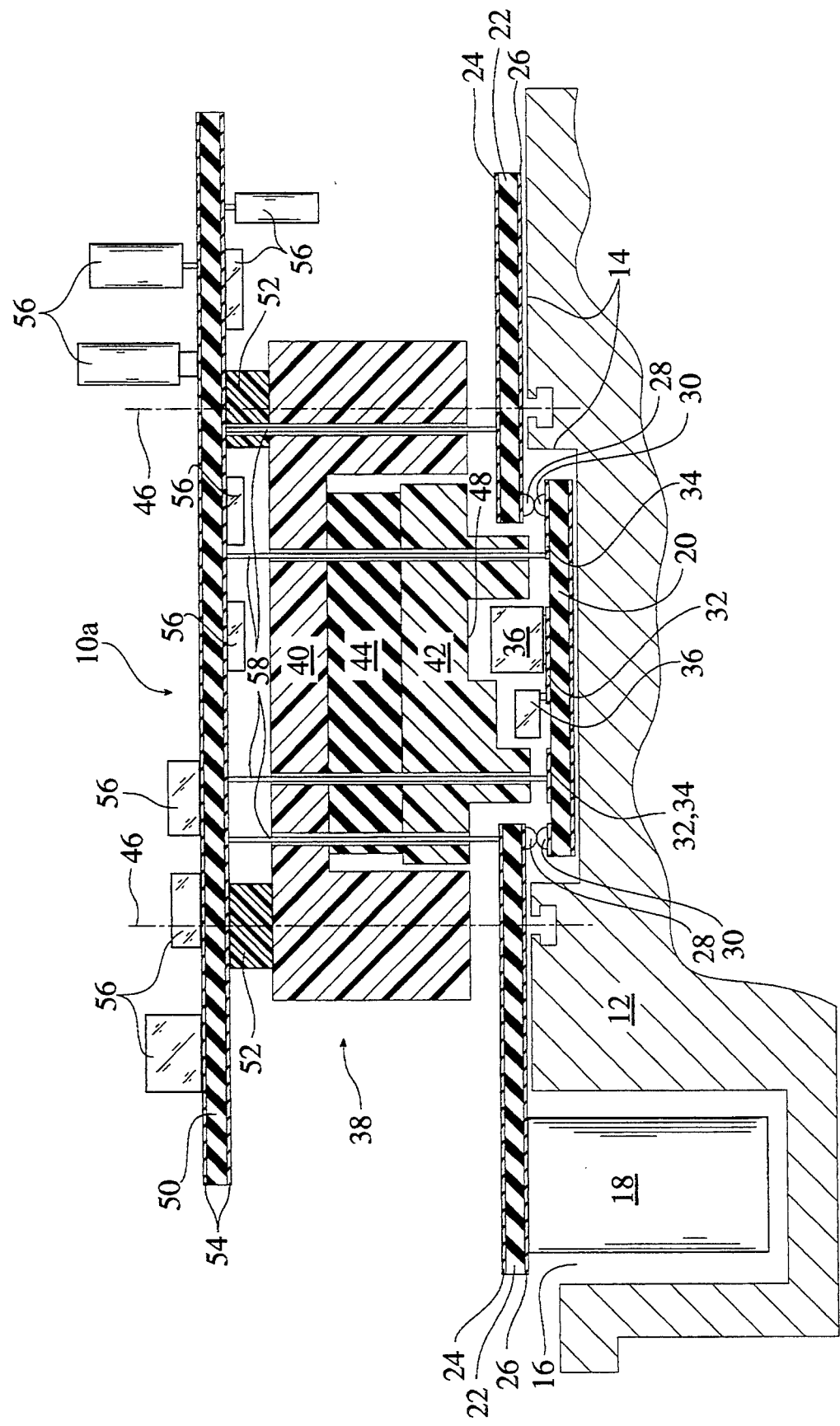
FIG. 1 is a cross-section of a circuit assembly having a heat sink according to an embodiment of the present invention.

Referring to FIG. 1, a circuit assembly 10a, according to an embodiment of the present invention, is shown. Circuit assembly 10a includes a heat sink 12 with a stepped receiving surface 14. Heat sink 12 also includes a receptacle 16 to accommodate a discrete component 18 connected to a carrier plate 22. Circuit assembly 10a may include many such elements as receptacle 16 and discrete component 18. Only one such pair is shown for clarity. Stepped receiving surface 14 receives carrier plate 22 and another carrier plate 20 will separate portions of stepped receiving surface 14. Carrier plate 22 includes conductive strips 24 and 26 to which component 18 is electrically connected. Stepped receiving surface 14 of heat sink 12 is shaped so that carrier plates 20 and 22, resting on respective steps of stepped receiving surface 14, are positioned in different parallel planes. The distance between the planes of the steps of stepped receiving surface 14 is such that contacts 30 on carrier plate 20 can make pressure contact with contacts 28 on carrier plate 22 when a platen 38 presses carrier plates 20, 22 to heat sink 12. Carrier plates 20 and 22 are staggered in a horizontal plane. Carrier plate 20 has conductive strips 32 on or near its surface. Carrier plate 20 also has contact surfaces 34 for connecting with similar surfaces on a substrate 50. Carrier plate 20 also includes heat-dissipating components 36 to be cooled. Components 36 may be, for example, uncovered semiconductor circuit ("chip") elements.

Circuit assembly 10a includes platen 38 for pressing carrier plates 20, 22 to heat sink 12 to facilitate heat transfer from carrier plates 20, 22 to heat sink 12. Platen 38 also aligns carrier plates 20 and 22 with respect to each other and with respect to heat sink 12. Another simultaneous function of platen 38 is to make connections between carrier plate 20 and substrate 50 through resilient contact elements 58 as described below. Still another function of platen 38 is to effect contact between respective contacts 28 and 30.

Platen 38 includes a rigid mounting element 40 and a rigid bridge element 42. Sandwiched between rigid mounting element 40 and a rigid bridge element 42 is a resilient cushion element 44. Rigid mounting element 40 and rigid bridge element 42 are made of suitable rigid materials, preferably non-conductive, such as plastic. Resilient cushion element 44 is made of a suitable resilient material, such as rubber. Platen 38 is fastened to heat sink 12 by suitable fastening means and its position precisely adjusted so that the pressure applied to carrier plates 20, 22 is optimal. The fastening means could a be a set of longitudinal connectors (not shown), such as bolts with nuts. Only center lines 46, which would correspond to such connectors, are shown.

Rigid bridge element 42 is designed with a stepped pressing base surface 48. When a stepped pressing base surface 48 is pressed against carrier plates 20, 22, it fixes positions of carrier plates 20, 22 in relation to each other, heat sink 12 and platen 38. Stepped pressing base surface 48 may have recesses to accommodate components 36. In addition, such recesses can serve to align components 36. Another use of the alignment capability of stepped pressing base surface 48 would be to align and press components 36 against component contacts (not shown) on carrier plates 20 and/or 22, thereby connecting the to circuits on carrier plates 20 and/or 22.

Platen 38 includes electrically insulating substrate 50, which is held at a specified distance front platen 38 by spacer elements 52. Components 56 are interconnected by a circuit network 54 on substrate 50. In circuit assembly 10a, substrate 50 is attached to a side of platen 38 that faces away from heat sink 12. Thus, substrate 50 is accessible for testing and replacement of components 56. Circuit network 54 on substrate 50 is electrically connected with associated contact surfaces 34 on carrier plates 20, 22 by resilient contact elements 58.

Resilient contact elements 58 are flexible to permit the position of platen 38, and connected substrate 50, to be adjusted. In addition, the flexibility of resilient contact elements 58 causes ends of resilient contact elements 58 to be forcibly pressed against contact surfaces 34 to insure positive electrical contact. Resilient contact elements 58 may be pins with elastic loops, angled pins, pins with a threaded section, or any other suitable device. Resilient contact elements 58 extend through passages in platen 38 which are located to position resilient contact elements 58 precisely. Resilient contact elements 58 may also be embedded in platen 38 or any of its components: rigid bridge element 42, resilient cushion element 44 and rigid mounting element 40. Ends of resilient contact elements 58 may electrically connect with corresponding contact surfaces 34 by being brought into pressure contact after assembly and adjustment of platen 38, substrate 50 and carrier plate 20, 22.

Figure 2:
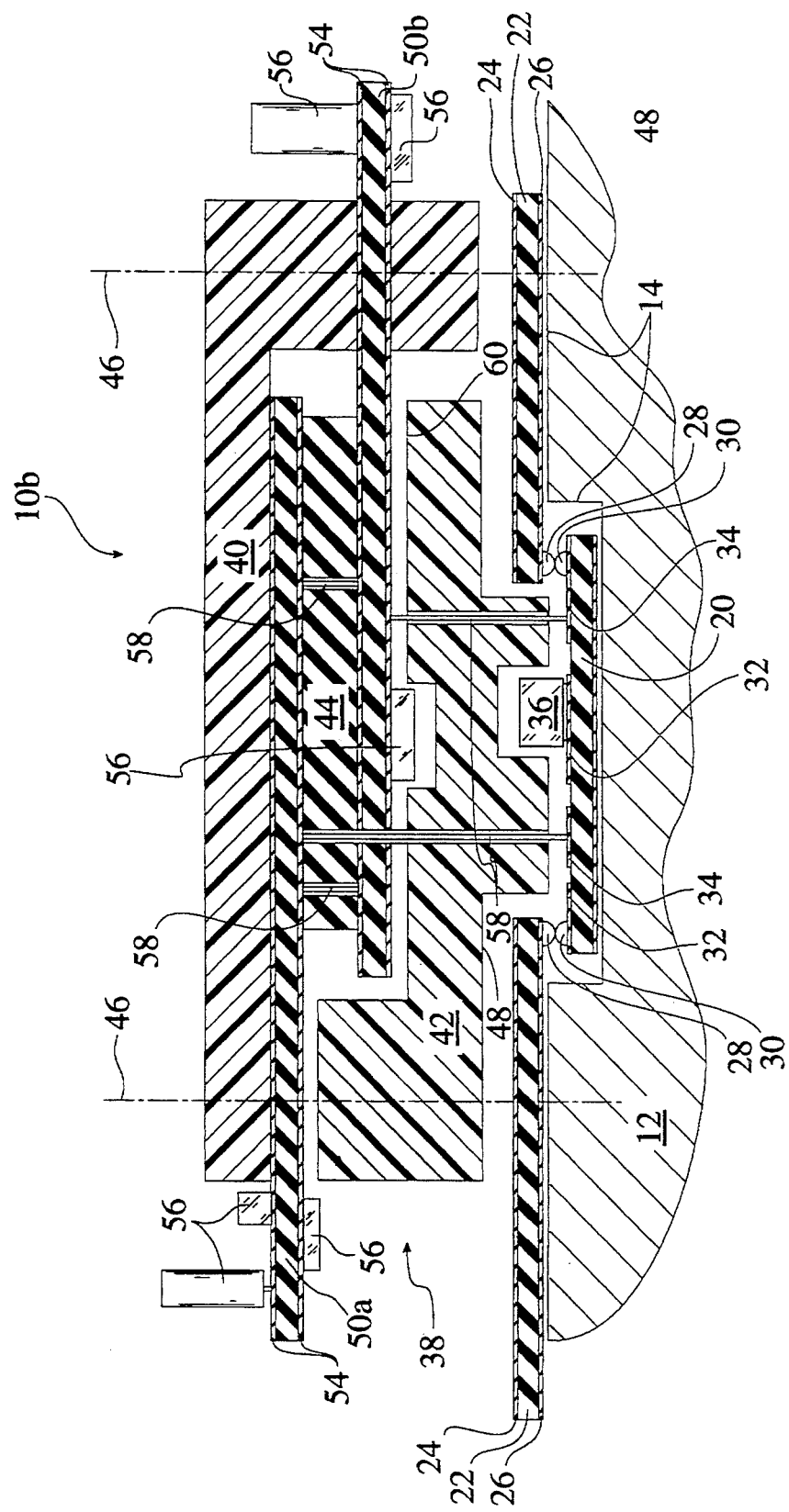
FIG. 2 is a cross-section of a circuit assembly having a heat sink according to another embodiment of tile present invention.

Referring to FIG. 2, a sectional view of a circuit assembly 10b, according to another embodiment of the present invention, is shown. Circuit assembly 10b differs frown circuit assembly 10a of FIG. 1 in that there are two substrates, a first substrate 50a and a second substrate 50b, instead of one. In addition, locations of substrates 50a and 50b are different in relation to rigid bridge element 42 and rigid mounting element 40. First substrate 50a is sandwiched between rigid mounting element 40 and resilient cushion clement 44. Second substrate 50b is sandwiched between resilient cushion element 44 and rigid bridge element 42. As in circuit assembly 10a, resilient contact elements 58 electrically connect substrates 50 with carrier plates 20, 22. Additional resilient contact elements 58 electrically connect the first substrate 50 with the second substrate 50.

In circuit assembly 10b, rigid bridge element 42 is attached to a side of substrate 50b that faces heat sink 12. Rigid bridge element 42 of circuit assembly 10b has stepped pressing base surface 48 on the side facing heat sink 12. Rigid bridge element 42 of circuit assembly 10b also has a stepped pressing base surface 60 on the side facing away from heat sink 12. Recesses in stepped pressing base surfaces 48 and 60 accomodate components 36 and 56 respectively.

Figure 3:
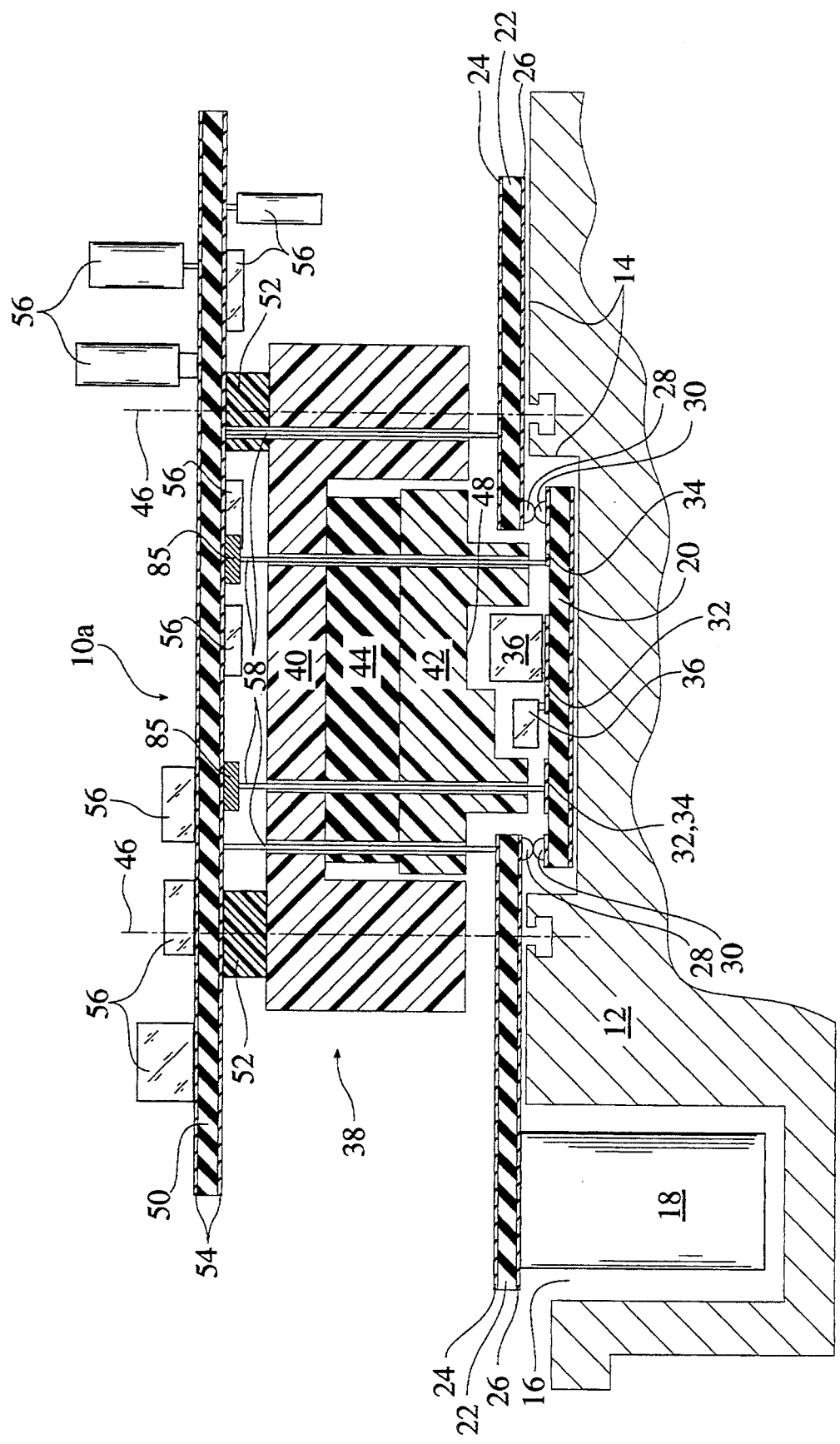
FIG. 3 is a cross-section of a circuit assembly having a heat sink according to still another embodiment of the present invention.

Referring to FIG. 3, a circuit assembly identical to the embodiment of FIG. 1, except for the inclusion of contact surfaces 85, is shown. Contact surfaces 85 are electrically connected components 56 and/or circuit network 54 on substrate 50. Contact surfaces 85 are electrically connected to resilient contact elements 58 when resilient contact elements 58 are pressed against contact surfaces 85. Thus, when platen 38 is assembled to carrier plates 20, 22, the connections between substrate 50 and resilient contact elements 58 and those between resilient contact elements 58 and carrier plates 20, 22 may be effected simultaneously.

Details of structure in FIGS. 2 and 3 that arc similar to those of FIG. 1 are given the same reference numbers as in FIG. 1, and are not described again.

In FIG. 1, no interconnections are shown between components 56 or circuit network 54 on opposite sides of substrate 50. However, note that it is possible for components 56 and/or circuit network 54 to be connected by conductors (not shown) passing through substrate 50 or around substrate 50. The same is true with respect to components 56 and circuit networks 54 on substrates 50a and 50b of FIG. 2.

The objects of the present invention are achieved by a circuit assembly that includes at least one electrically insulating substrate 50, 50a and/or 50b attached to a platen 38 and located a distance from carrier plates 20, 22 which contain high heat-dissipating components 36. At least one of substrates 50, 50a and 50b is positioned parallel to carrier plates 20, 22, permitting electrical connection between the substrate and carrier plate 20, 22 to be conveniently achieved by means of resilient contact elements 58 in platen 38. Platen 38 is thus used for pressing carrier plates 20, 22 to heat sink 12 to facilitate cooling and also for effecting electrical contact between circuits on one or both of carrier plates 20, 22 and substrate 50, 50a, and/or 50b by means of resilient contact elements 58. The pressing of platen 38 effects electrical contact between carrier plate 20 and carrier plate 22 through contacts 28 on carrier plates 20 and 22. In addition, the pressing of platen 38 fixes positions of carrier plates 20, 22 with respect to each other and with respect to heat sink 12.

At least one electrically insulating substrate 50, 50a and/or 50b is mounted in a plane that differs from that of at least one of carrier plates 20, 22. Resilient contact elements 58 provide a means for connecting circuit network 54 and components 56 to components 36 on carrier plate 20. Resilient contact elements 58 are precisely and accurately positioned by platen 38. Thus, platen 38 serves not only press each carrier plates 20, 22 against heat sink 12 to facilitate heat removal, but also to position resilient contact elements 58, thereby establishing desired connections between substrates 50, 50a and/or 50b and carrier plates 20, 22. The assembly of carrier plates 20, 22, platen 38 and respective substrates 50, 50a and/or 50b also establishes and fixes the mutual physical positions of these elements relative to each other for packaging purposes.

The accuracy of the positioning of resilient contact elements 58 may be sufficient to permit chips on any of substrates 50, 50a and/or 50b to be connected directly by means of resilient contact elements 58. A chip may be connected to circuit assembly 10a or 10b by pressing resilient contact elements 58 in platen 38 directly to contact points on the chip itself. A circuit assembly designed in that way has the advantage of permitting a high degree of integration. In addition, because of the accessibility of components 56 and circuit network 54 on substrates 50, 50a and/or 50b, and carrier plates 20, 22, electrical pretesting of all components is possible prior to the final assembly of circuit assembly 10a, 10b.

Note, also, that multiple fastening of components 36 in relation to each other is possible with the present invention. That is, platen 38 with integral recesses in stepped pressing base surface 48 serves to position components precisely. In addition, with such fastening, simple, reliable and mechanically accurate contacting of the appropriate components with each other or with associated circuit structures is also feasible. Moreover, the occasional need to disassemble and replace defective components with unused new components is facilitated because circuit assemblies 10a and 10b may be taken apart and reassembled without destroying any circuit elements.

Circuit assembly 10b has at least one substrate 50b located between electrically insulating rigid bridge clement 42 and electrically insulating resilient cushion element 44 of platen 38. The appropriate positioning of resilient contact elements 58 between substrate 50b and carrier plate 20 is accomplished in this case by rigid bridge element 42. Resilient contact elements 58 in rigid bridge element 42 are located to make appropriate connections between substrate 50b and carrier plate 20. Additionally, with this configuration, at least one substrate 50b is thus positioned, by rigid bridge element 42 and resilient cushion element 44, to fit exactly.

Another possibility is to locate substrate 50a between electrically insulating resilient cushion element 44 and electrically insulating rigid mounting element 40 of platen 38. Resilient contact elements 58 are positioned, by electrically insulating rigid bridge element 42 and resilient cushion element 44, to fit exactly and to make contact between carrier plate 20 and substrate 50a. Resilient contact elements 58 are positioned, by electrically insulating resilient cushion element 44, to fit exactly to make contacts between substrate 50a and substrate 50b when second substrate 50b is also present, as in circuit assembly 10b.

Circuit components 56 and portions of circuit network 54 within platen 38 may be inaccessible in, for example, circuit assembly 10b, because portions of substrates 50a and/or 50b may be sandwiched within platen 38. However, it is problem can be avoided, where necessary, by locating components 56, for which accessibility is desired, on portions of substrate 50a or 50b that are outside of platen 38. In other words, components 56, for which accessibility is desired, can be located on portions of substrates 50a and/or 50b that are not sandwiched between one of rigid bridge element 42, resilient cushion element 44 and rigid mounting 40 and another of rigid bridge element 42, resilient cushion element 44 and rigid mounting 40. Another way to avoid making components inaccessible is to mount substrate 50a or 50b on a side of rigid bridge element 42 facing away from heat sink 12 so that its entire surface is accessible.

In circuit assembly 10a it is advantageous for substrate 50 to be removed frown rigid mounting element 40 by spacer elements 52. Spacer elements 52 can be separate elements or integral with rigid mounting element 40.

In circuit assemblies 10a and lob, it is advantageous to stagger carrier plates 20 and 22 if more than one is used. Staggering facilitates pressing electrical contacts 28 when carrier plates 20, 22 are pressed to heat sink 12. Stepped receiving surface 14 of heat sink 12 serves to position carrier plates 20, 22 with respect to each other to insure proper alignment of contacts 28. Circuit assemblies 10a and 10b are simply designed and can be easily and rapidly assembled because of the automatic locating function of stepped receiving surface 14 of heat sink 12. This ease of assembly also facilitates repair.

In circuit assemblies 10a and 10b, it is also advantageous for heat sink 12 to have a receptacle 16 for each discrete component 18 on carrier plate 22. Discrete component 18 could be a power capacitor, electrical reel or current sensor. Receptacle 16 and heat sink 12 advantageously promotes dissipation of heat from discrete component 18. The promotion of heat dissipation permits compact configurations which may increase circuit speeds by reducing circuit paths. Compactness may also be desirable as an end in itself. An example of a type of circuit that takes advantage of the characteristics of the present invention is rectifier circuit assembly. Power components of the rectifier circuit assembly would be located on carrier plates 20, 22. One or more substrates 50, 50a and/or 50b would have the non-power components of the circuit. In this configuration, the non-power components remain accessible for modification and testing.

Note that the above advantages apply to circuits employing multiple discrete components, of which discrete component 18 shown in FIGS. 1 and 3 is merely representative. Many such discrete components could be mounted on the same carrier plate 20 and/or 22.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A high density circuit assembly, comprising:
a heat sink;
a carrier plate having at least one component to be cooled;
a platen having a substrate attached thereto;
structure pressing said carrier plate against said heat sink, whereby said carrier plate and said at least one component are cooled;
said substrate having a first circuit;
said carrier plate having a second circuit;
said substrate being substantially parallel to said carrier plate;
said platen having a conductor electrically connecting said first circuit to said second circuit; and
said platen having further a rigid mounting element, a rigid bridge element, and a resilient cushion element positioned between said rigid mounting element and said rigid bridge element.

2. Apparatus as in claim 1, wherein
there are contact surfaces on said carrier plate;
said contact surfaces are connected to said second circuit;
resilient contact elements are attached to said platen;
said resilient contact elements are electrically connected to said first circuit of said substrate; and
said resilient contact elements are positioned by said platen such that they touch ends of said resilient contact elements to respective ones of said contact surfaces when said platen is pressed against said carrier plate.

3. Apparatus as in claim 2, further comprising:
a semiconductor component on said carrier plate; and
at least one of said resilient contact elements positioned such that it makes electrical contact with said semiconductor component.

4. Apparatus as in claim 1, wherein:
said substrate is positioned between said rigid mounting element and said resilient cushion element.

5. Apparatus as in claim 1, wherein:
said substrate is positioned between said rigid bridge element and said resilient cushion element.

6. Apparatus as in claim 5, wherein:
another substrate, having a third circuit, is positioned between said rigid mounting element and said resilient cushion element; and
said resilient cushion element incorporates resilient contact elements electrically connecting said first circuit with said third circuit.

7. Apparatus as in claim 5, wherein:
another substrate, having a third circuit, is positioned between said rigid mounting element and said resilient cushion element; and said resilient cushion element incorporates resilient contact elements electrically connecting said first circuit with said third circuit.

8. Apparatus as in claim 1, wherein:

said platen lies between said substrate and said carrier plate;

each of said first circuit and said second circuit includes a respective contact element in electrical contact with said conductor; and at least one of said rigid bridge element, said rigid mounting element, and said resilient cushion element holds said conductor in a fixed position, whereby said conductor is aligned with said respective contact element of said first circuit and said second circuit.

9. A high density circuit assembly, comprising:

a heat sink;

carrier plates;

at least one of said carrier plates having at least one component to be cooled;

each of said carrier plates having a circuit;

two of said carrier plates being substantially parallel and lying in substantially different planes;

a platen pressing said carrier plates against said heat sink;

a substrate on said platen;

said substrate having a circuit;

said substrate being substantially parallel to said carrier plates;

a conductor electrically connecting said circuit of at least one of said carrier plates to said circuit of said substrate;

said heat sink having a recess receiving a first of said two;

a second of said two being positioned such that a second overlapping portion of said second of said two overhangs a first overlapping portion of said first of said two;

said first overlapping portion and said second overlapping portion each including contacts; and said contacts being located to make electrical contact between said first of said two and said second of said two.

10. Apparatus as in claim 9, wherein:

there are contact surfaces on said at least one of said carrier plates;

resilient contact elements are attached to said platen;

said resilient contact elements are electrically connected to said circuit of said substrate; and said resilient contact elements are positioned by said platen such that they touch ends of said resilient contact elements to respective ones of said contact surfaces.

11. A high density circuit assembly, comprising:

a heat sink;

two carrier plates;

a first of said two having a first circuit;

a second of said two having a second circuit;

at least one of said two having at least one component to be cooled;

a platen pressing said carrier plates against said heat sink;

said platen having a rigid bridge element with a pressing surface pressing against said at least one of said two;

said platen having a rigid mounting element;

a resilient cushion element between said rigid mounting element and said rigid bridge element;

at least one substrate between said resilient cushion element and said rigid bridge element;

said at least one substrate being substantially parallel to said carrier plates;

said at least one substrate having a third circuit; and said platen having a first conductor electrically connecting said third circuit to at least one of said first circuit and said second circuit.

12. Apparatus as in claim 11, wherein:

said at least one substrate includes at least two substrates; and said platen includes a second conductor electrically connecting a first of said at least two substrates to a second of said at least two substrates.

13. Apparatus as in claim 11, wherein:

there are contact surfaces on said at least one of said two carrier plates;

resilient contact elements are attached to said platen;

said resilient contact elements are electrically connected to said third circuit of said at least one substrate; and said resilient contact elements are positioned by said platen such that they touch ends of said resilient contact elements to respective ones of said contact surfaces.

14. Apparatus as in claim 11, wherein:

there are first contact surfaces on said at least one of said two carrier plates;

there are second contact surfaces on said at least one substrate;

resilient contact elements are movably attached to said platen;

said resilient contact elements are positioned by said platen such that they touch first ends of said resilient contact elements to respective ones of said first contact surfaces; and said resilient contact elements are positioned by said platen such that they touch second ends of said resilient contact elements to respective ones of said second contact surfaces.

15. Apparatus as in claim 13, further comprising:

a semiconductor component on said carrier plate; and at least one of said resilient contact elements being positioned to make electrical contact with said semiconductor component.

16. Apparatus as in claim 14, further comprising:

a semiconductor component on said carrier plate; and at least one of said resilient contact elements being positioned to make electrical contact with said semiconductor component.

17. Apparatus as in claim 16, wherein:

said platen has a rigid mounting element and a rigid bridge element; and said platen has a resilient cushion element positioned between said rigid mounting element and said rigid bridge element.

18. A high density circuit assembly, comprising:

a heat sink;

carrier plates;

said heat sink having at least one recess receiving at least one of said carrier plates;

each of said carrier plates having a circuit;

a platen pressing said carrier plates against each other;

said at least one of said carrier plates occupying a plane different from the plane occupied by at least another of said carrier plates such that a first portion of said at least one of said carrier plates overlaps a second portion of said at least another of said carrier plates;

first contacts on said first portion;

second contacts on said second portion; and said first contacts being positioned to make electrical contact with said second contacts.

19. Apparatus as in claim 18, further comprising:

first contact surfaces on said at least one of said carrier plates;

said platen having a substrate;

said substrate having a first circuit;

said at least one of said carrier plates having a second circuit;

resilient contact elements attached to said platen;

said resilient contact elements being electrically connected to said first circuit of said substrate; and said resilient contact elements positioned by said platen such that they touch ends of said resilient contact elements to respective ones of said contact surfaces.

20. A high density circuit assembly, comprising:

a heat sink;

two carrier plates;

a first of said two having a first circuit;

a second of said two having a second circuit;

at least one of said two having at least one component to be cooled;

a platen pressing said carrier plates against said heat sink;

said platen having a rigid bridge element with a pressing surface pressing against said at least one of said two;

said platen having a rigid mounting element;

a resilient cushion element between said rigid mounting element and said rigid bridge element;

at least one substrate between said resilient cushion element and said rigid mounting element;

said at least one substrate being substantially parallel to said carrier plates;

said at least one substrate having a third circuit; and said platen having a first conductor electrically connecting said third circuit to at least one of said first circuit and said second circuit.

* * * * *

UNITED STATES PATENT AND TRADEMARK OFFICE
CERTIFICATE OF CORRECTION

PATENT NO. : 5,438,479

DATED : August 1, 1995

INVENTOR(S) : Heinrich HEILBRONNER

It is certified that an error appears in the above-identified patent and that said Letters Patent is hereby corrected as shown below:

Column 2, lines 15, 22, 49, 52 and 54, change "tile" to --the--;
            line 61, change "tile" (both occurrences) to --the--;
            lines 62 and 64, change "tile" to --the--;
            line 66, change "compacting" to --connecting--; change "tile" to --the--.

Column 3, lines 24 and 26, change "tile" to --the--;
            line 30, change "tile" (both occurrences) to --the--;
            line 41, change "tile" (both occurrences) to --the--.

Column 5, line 25, change "frown" to --from--;
            line 60, change "arc" to --are--.

Column 7, line 39, change "frown" to --from--;
            line 43, change "lob" to --10b--.

Signed and Sealed this

Fourteenth Day of November, 1995

*Attest:*

BRUCE LEHMAN

*Attesting Officer*            *Commissioner of Patents and Trademarks*